United States Patent [19]

Jagusch et al.

[11] Patent Number: 4,549,843
[45] Date of Patent: Oct. 29, 1985

[54] MASK LOADING APPARATUS, METHOD AND CASSETTE

[75] Inventors: Peter R. Jagusch; W. Thomas Novak, both of San Jose, Calif.

[73] Assignee: Micronix Partners, Los Gatos, Calif.

[21] Appl. No.: 475,439

[22] Filed: Mar. 15, 1983

[51] Int. Cl.$^4$ ............................................. H01L 21/02
[52] U.S. Cl. ................................ 414/416; 414/752; 414/786; 118/504; 118/720; 206/328; 206/332; 206/334; 206/454
[58] Field of Search ............... 414/403, 411, 416, 589, 414/786, 752; 206/328, 332, 334, 454; 118/504, 505, 720, 721; 53/109, 381 A, 492

[56] References Cited

U.S. PATENT DOCUMENTS

| | | | |
|---|---|---|---|
| 3,263,842 | 8/1966 | Holstein | 414/411 |
| 3,272,350 | 9/1966 | Pflaumer et al. | 414/416 |
| 3,719,023 | 3/1973 | Richardson | 53/381 A |
| 3,870,175 | 3/1975 | DiIanni | 414/411 |
| 3,957,371 | 5/1976 | Rich | 118/504 X |
| 4,208,159 | 6/1980 | Uehara et al. | 414/416 X |

FOREIGN PATENT DOCUMENTS 0040952 3/1982 Japan ................................. 414/416

OTHER PUBLICATIONS

Pinckney, et al., "IBM Technical Disclosure Bulletin, vol. 15, No. 11, (Apr. 1973), p. 3520.

Primary Examiner—Robert J. Spar
Assistant Examiner—Ken Muncy
Attorney, Agent, or Firm—Thomas S. MacDonald; Alan H. MacPherson; Steven F. Caserza

[57] ABSTRACT

A mask loading apparatus and method employing a cassette (200) detachably mounted on an in-out cassette holder (212). The cassette is made of low Z-materials, and comprises a cover (211) and a bottom mask-supporting tray (202) locked by machine-operable locking members (224) to the cover. A lift cylinder (218) has a vacuum cup (216) which is raised to support and hold the underside (213) of the tray and, when the tray is unlocked from the cover, to move the vacuum cup, tray and mask downwardly and then laterally by a transport arm (203) to a fixed location under a mask holder (205, 220) in a lithographic apparatus.

The lift cylinder then raises the cup, tray and mask to abut the mask holder and to transfer the mask to the mask holder. The lift cylinder and empty tray is then lowered and removed from a position blocking the mask as it is to be used in the lithography processing. A reversal of the sequence of steps is utilized to unload the mask from its use mode and return it to its cassette cover. An anti-rotation pin (222) prevents tray movement in the cassette and pins (236) prevent mask movement on the tray. Indication bar code or read hole or clear window (231, 232 and 230) automatically show whether a mask or calibration plate is in a cassette to be transported.

17 Claims, 7 Drawing Figures

U.S. Patent  Oct. 29, 1985  4,549,843
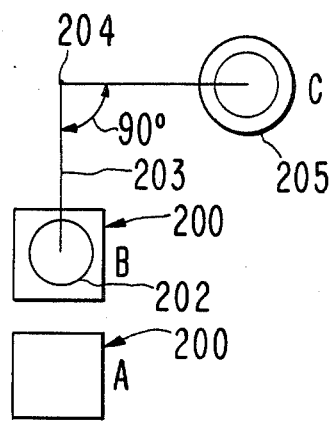
FIG.1
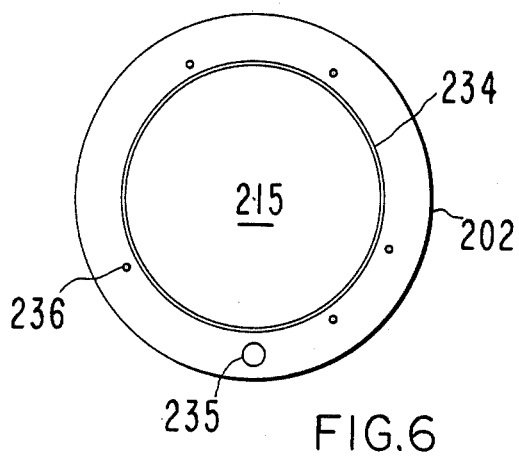
FIG.6
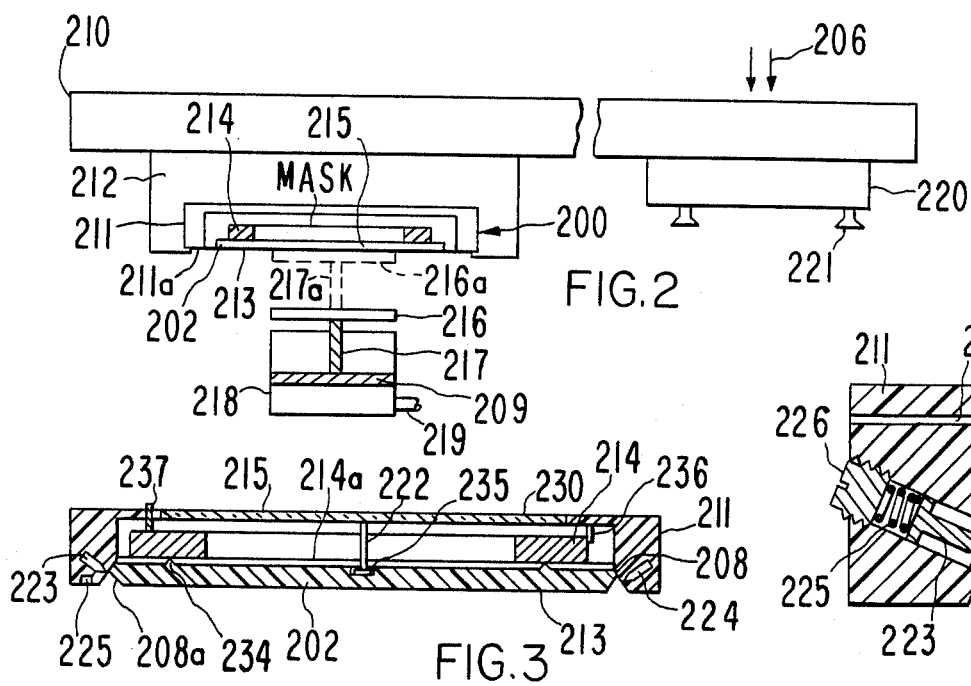
FIG.2
FIG.3
FIG.7
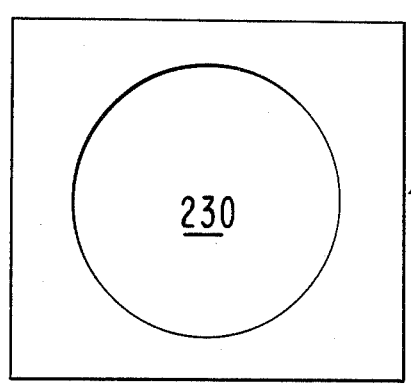
FIG.4
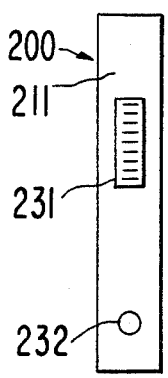
FIG.5

MASK LOADING APPARATUS, METHOD AND CASSETTE

CROSS-REFERENCE TO RELATED APPLICATIONS

This invention relates to and is useful in the lithography system shown in U.S. patent application Ser. No. 475,430 filed Mar. 15, 1983, now U.S. Pat. No. 4,514,858, entitled "Lithography System" by W. Thomas Noval, Inventor, and may be utilized with that invention shown in U.S. application Ser. No. 475,427 filed Mar. 15, 1983, entitled "Mask Alignment Apparatus" by Anwar Husain, Inventor, each filed concurrently herewith and assigned to the assignee of this application. The subject matter of each of the above-identified co-pending applications is incorporated herein by reference.

BACKGROUND OF THE INVENTION

1. Field of the Invention

The present invention relates to an apparatus and method for loading a mask into a lithographic system employed in the fabrication of integrated circuits in semiconductor wafers or other substrates and an improved cassette usable with the apparatus. More particularly, the improved apparatus and cassette are useful in manufacturing semiconductor devices where X-ray printing circuit geometries to 0.5 micrometer or smaller are desired. X-ray interfering particle generation must be kept to a minimum when loading or unloading the mask into the lithography apparatus and in removing and replacing the mask in a cassette so as to prevent anomalies in the X-ray processing which utilizes the mask.

2. Description of the Prior Art

Heretofore, cassettes have been employed to store masks and allow their automatic removal. For example, a mask has been mounted on a flat tray and a cover placed thereover and held to the tray with locking fingers. means have been provided to open the locking fingers and to raise the cover to allow mechanical fingers on a transport arm to physically grasp the edges the of mask and move it to a vacuum holder on the photolithography apparatus. Such a system often results in relative rubbing between the mask and tray in storage, handling, unloading or loading, and between the mask and the mechanical fingers, resulting in the generation of very fine particles from the mask, tray or fingers. These fine particles if present on the operable printing portion of the mask, may be absorbive of X-ray eminations resulting in subsequent misprinting of images on the semiconductor wafer. This diminishes integrated circuit yields from that wafer. The prior art mask transport and cassette system have not afforded the cleanliness necessary for the exacting specifications in this field. The prior art further has not included calibration means operable in the same transport system for initially setting the gap between a mask aligner and the wafer and which clearly informs a user whether a mask or calibration disc is being loaded.

SUMMARY

The present invention provides a cassette and mask transport apparatus and method which assures maximum cleanliness of the overall system and avoids the generation of very fine particles which might interfere with the X-ray lithography process in which the mask is primarily to be used. The cassette utilizes low Z-number materials, i.e., those having low atomic number with low absorption of X-rays which, if particles are generated, do not generally affect the X-ray lighorgraphy process. None of the operative surfaces of the mask is touched by the cassette or by the transporting and mask transferring mechanisms.

A cassette having an open-bottomed cover and a removable locked bottom tray mounting a mask or calibration plate is placed in a support member so that the tray, upon it being unlocked from the cover, can be withdrawn downwardly from the cover. This operation is performed by a tray supporting means in the form of a vacuum-cup lift cylinder which raises to abut and capture the tray and supported mask; move it downwardly and transport it on an arm to a fixed position in the lithographic apparatus where the mask is then raised by the lift cylinder into abutment with and transferred to a mask-holder contained in the lithography apparatus. A reversal of the steps allows the same structure to unload the mask from the lithography apparatus and return it to the protective cassette. A series of masks, each in its own cassette, is normally employed in the sequence of fabrication steps needed to manufacture integrated circuits on semiconductor wafers.

The invention also includes means to prevent movement of the mask within the cassette and various means for identifying the particular mask or if a calibration plate is present in the cassette.

BRIEF DESCRIPTION OF THE DRAWINGS

FIG. 1 is a general schematic top view of the cassette and mask transport system showing movement to a loading position in a mask holder which is part of an X-ray lithographic apparatus.

FIG. 2 is a partial cross-sectional view of the mask unloading, transport and unloading apparatus.

FIG. 3 is a cross-sectional view of the mask cassette.

FIG. 4 is a top view of the mask cassette.

FIG. 5 is a side view of the mask cassette.

FIG. 6 is a top view of the mask cassette tray.

FIG. 7 is a detail cross-sectional view of the tray-to-cover locking device.

DETAILED DESCRIPTION

The general operation of the mask cassette and transport system is seen in FIG. 1. A cassette which has been first loaded by the operator into a mask loading mechanism at Point A is moved outside that loading mechanism to a Point B. At that position, a lift cylinder positioned below the cassette and which contains a top vacuum cup, rises upwardly and engages the mask cassette bottom or tray. The tray is then vacuum-attached to the vacuum cup. The tray is unlocked from the cassette cover and is vertically lowered out of the cassette cover and laterally transported by arm 203 through an arc such as a 90° arc as illustrated, around a pivot 204 to a displaced position C under a mask holder 205 which is part of the overall X-ray photolithography apparatus. At this Point C, the lift cylinder raises the mask cassette tray, with the mask supported on its top surface, to the up position to abut the mask holder 205. The mask holder contains spaced suction cups which attach to peripheral edges of the mask supported by the tray and upon movement in the downward direction of the lift cylinder and attached tray, the mask alone is left attached to the mask holder. The arm then rotates around its pivot to an "out" position, unblocking the passageway above and below the operative portions of the mask, allowing the X-ray photolithography processes to proceed with the mask in its loaded operable position.

Unloading of the mask from mask holder 205 is performed by a reversal of the sequence of steps, namely, bringing the rotating arm, lift cylinder and tray back under the mask, transferring the mask to the top of the tray by releasing the suction cup attachment contained on the mask holder, lowering the lift cylinder and re-transporting it back to the underside of the cassette cover at Point B where the mask and tray are raised into the cover, locked, and returned to Point A.

FIG. 2 illustrates in more detail the above-described mask transport system. A base plate 210 or other fixed structure is provided which extends from a position adjoining a mask holder 220 provided at a fixed location in the lithography apparatus under an X-ray, ultraviolet or ion beam source 206 and above an aligning mechanism for a wafer which is mounted below the mask for photographic imaging. In operation, X-rays 206 pass through the mask onto the wafer (not shown). The wafer itself is mounted on a wafer stage positioned below the mask holder 220. Such positioning is shown in the above-recited co-pending patent applications.

An in-out cassette holder 212 is fixed to the base plate 210 and the cassette 200 mounting a mask 214 on a bottom tray 202 is mounted by its cover 211 to the in-out mechanism 212. In-out cassette holder 212 may comprise a central apertured platform to support the bottom edges 211a of cassette top 211 and is adapted to move the cassette laterally outward on rails to a position such as position B in FIG. 1. A lift cylinder 218 is positioned below the cassette 200 in position B (FIG. 1). Lift cylinder 218 includes a fluid-operated (liquid or pneumatic) piston 209 and piston rod 217 (217a in the up position) which functions to raise a table having a vacuum cup 216 thereon into a central position at 216a on the underside 213 of tray 202. The tray 202 is then vacuum-attached to cup 216 in its up position, and unlocked from cover 211 so that the tray, vacuum cup 216 and piston rod 217 may be moved to the down position. Thus, mask 214 is removed from cassette cover 211 without any mechanism touching the mask. The lifting cylinder is then rotated or otherwise moved by arm 219 or by suitable rail structure (not shown) to a displaced position laterally along base plate 210. At this displaced position, the lifting cylinder and the tray with its supported mask is positioned below mask holder 220, is raised so that the edges of the mask 214 abut spaced suction cups 221 on the bottom periphery of mask holder 220 and a vacuum drawn to attach the mask to the cups 221. The mask is then in a position to be accurately aligned with respect to the X-rays 206 and the wafer-holding alignment stage.

Alternatively, provision may be made to move cover 211 separately or with its supporting structure 212 upwardly after the lift cylinder has been positioned under the tray 202 and the locking means unlocked. The lift cylinder and attached mask-containing tray may then be moved laterally on arm 219.

FIG. 3 is a detailed view of the cassette. It comprises an open-bottom cover 211 of any peripheral shape, such as circular, square or octagonal. A preferably circular bottom tray 202 extends across the open bottom of the cover 211. The edges of the tray 202 and the interior edges of the cover are tapered as at 208 to provide a close, self-aligning fit to prevent ingress of dust or other particles into the confines of the cassette. A mask 214 which normally has a central membrane 214a with the mask operating portions thereon is mounted on a ridge on tray surface 215. Alternatively, as hereafter described, a calibration date or mask may be placed on the tray surface 215. The cassette top normally has a clear, transparent window 230 on its top side so as to allow visual observation to verify the contents of the cassette.

The cassette is normally colored differently for those cassettes which are to house masks and for those cassettes which are to house quartz calibration plates. This further identifies the contents of the cassette, reducing human error.

An anti-rotation pin 222 is provided at one edge of the cassette cover top which permits the tray to be installed in but one, single location, preventing tray misalignment and rotation inside cover 211. Pin 222 registers with and enters into aperture 235 in the peripheral top surface of tray 202. The mask may contain flats for registration with pins 236 or may have V-notches on its periphery meshing with pins 236.

A series of locking members 223 and 224 normally four in number, are placed around the periphery of the vertical walls of the cover 211 in position so that in inward movement to dotted portion 228, they lock tray 202 into the bottom of cover 211, for example, by abutting surface 208a or entering into apertures in the edge of tray 202. These locking pins normally are spring loaded by helical springs 225 held in-place by a screw plug 226 as is well known in the locking art in the lock position and may be unlocked pneumatically by pneumatic pressure in line 227 for moving a piston and the pins 223, 224 to compress spring 225 and move the bullet end on the pins out of locking engagement with surface 208a. Thus, a locking means is provided which can only be operated by machine, and a human operator cannot easily open the cassette to disturb or contaminate the mask. FIG. 7 shows a detailed view of the tray locking-unlocking mechanism.

Mask cover 211 also contains an aperture at an exterior bottom position which registers with a pin (not shown) on the in-out loading mechanism 212 so that the mask cassette can be loaded into the mechanism in only one way, thus keying the mask in its rotational orientation to its eventual position on the mask holder. Pins 237 extending through cover 211 and having a mask edge abutting tip may be utilized to prevent shaking or vibration of the mask.

FIG. 4 is a top view of cassette 200 showing the clear window 230 for viewing the contents of the cassette.

FIG. 5 is a side view of the cassette cover 211 which contains a bar code 231 for automatically identifying particular mask parameters to a machine so as to provide mask-to-wafer compatability verification and/or automatic setup of the X-ray lithography process. For example, this would include exposure time, step mode, coordinates, etc., dictated by the particular mask being transported to the X-ray lithography work station. The bar code is read automatically when the cassette is loaded from Point A to Point B in FIG. 1. The edge portion of the cover may also contain a machine read hole 232 which may identify the contents as containing either a quartz calibration plate or a mask. If the former, the indicator then causes the lithography apparatus to automatically function in the calibration mode of operation. This machine read aperture may be a magnetic indicator or be of a particular surface which is sensed by a photocell.

FIG. 6 shows the top view of the tray and includes a mask supporting ridge 234 extending peripherally around the tray. Ridge 234, in an operable embodiment, is 0.6 inches wide and 0.2 inches high. The peripheral non-operating edges of the mask rest on the ridge. The series of mask-locating pins 236 are provided exteriorly of ridge 234 for accurately locating the mask with respect to the tray. These pins locate the mask edges. Anti-rotation aperture 235 is also seen on the periphery of the upper side of the tray 202. By reason of ridge 234, the operable portions of the mask 214a fit above and are spaced from the top surface 215 on the upper side of the tray.

The cassette, including the cover and tray, is made from so-called Z-materials which are of low atomic number and are relatively non-absorbive of X-rays. Examples of such materials are, aluminum, Delrin acetal plastic, Teflon trifluoro-chloro-ethylene plastic or other types of plastics, preferably of a material which is molded or castable.

A quartz calibration plate is placed within the cassette and transported to the mask holder as if a mask and mounted on suction cups 221. Through the use of various acoustic sensors, the gap distance between a to-be-mounted mask and a wafer holding stage is very accurately determined. After calibration, the calibration plate is returned to its calibration cassette and a series of masks are then sequentially loaded and unloaded into the mask holder contained in the X-ray photolithography apparatus to perform the various fabrication steps on the wafer.

The cassettes of this invention are adapted to mount circular masks, square masks, or octogonal masks having nominal thicknesses of ¼" or more. The cassettes are also capable of mounting calibration plates of the same shapes with variable thicknesses. The cassettes are washable in dishwashers or in industrial-type cleaning apparatus. They are capable of aligning the mask rotationally to within ±1° of arc. They prevent manual removal of the mask or plate from the cassette without the use of a special loading/unloading fixtures.

The above description of the advantages and the preferred embodiment of this invention is intended to be illustrative only, and not limiting. Other embodiments of this invention will be apparent to those skilled in the art in view of the above disclosure.

We claim:
1. A mask transport apparatus comprising:
a fixed support member;
a semiconductor wafer mask-holding cassette having an cassette cover with an open-bottom adapted to be held by said support member;
said cassette including a flat cassette bottom tray extending across said cover open-bottom, said cassette tray adapted in use to carry a mask on a top surface of said cassette tray;
tray locking means for locking and unlocking said cassette tray with respect to said cassette cover;
tray support means positionable against the underside of said cassette tray and operable in the unlocked mode of said cassette tray for abutting a bottom surface of said cassette tray and for supporting said cassette tray; and
means for separating said cassette tray from said cassette cover by relative movement of said tray support means and said cassette cover such that said cassette tray is moved out of and away from said cassette cover.

2. The invention of claim 1 further comprising
means for mounting a semiconductor wafer mask at a position on a top surface of said cassette tray; and
means for transporting said cassette tray and said mounted mask from said cassette cover to a position displaced from said cassette cover.

3. The invention of claim 1 wherein said means for separating said cassette tray from said cover comprises means connected to said tray support means for lowering said cassette tray out of said cassette cover.

4. The invention of claim 2 including means at said position displaced from said cassette cover in fixed relation to said support member for attaching the mounted mask at said position.

5. The invention of claim 4 in which said means for attaching the mounted mask is a mask aligner.

6. The invention of claim 5 in which said mask aligner includes vacuum holding means adapted to hold the mask transported to such vacuum holding means by said means for transporting said cassette tray.

7. The invention of claim 1 which said locking means comprises a series of translatable spring-loaded pins extending from a depending wall meber of said cassette cover to engage a peripheral edge of said cassette tray.

8. The invention of claim 1 wherein said tray support means comprise vacuum holding means and means for moving said cup vertically into and out of a support position.

9. The invention of claim 8 in which said vacuum holding means is fixedly attached to a piston contained in a piston cylinder, said piston being fluid-operated to raise and lower said vacuum holding means to and from a cassette tray supporting position.

10. The invention of claim 1 including a calibration mask in said cassette.

11. The invention of claim 1 including a calibration mask in said cassette, said calibration mask being transported to said position displaced from said cassette cover to calibrate a mask-holding apparatus at said position displaced from said cassette cover.

12. The invention of claim 11 including means in said cassette for indicating the presence of a calibration mask on said cassette bottom tray so as to initiate calibration procedures at said position displaced from said cassette cover.

13. The invention of claims 1, 2 or 10 wherein said cassette and a supported mask is used in X-ray semiconductor photolithography.

14. A method of transporting and loading a mask to a fixed position in a mask-using lithographic system comprising
placing a cassette having a top cover and a bottom movable tray locked therewith into a loading mechanism, said tray having a mask seated on an interior surface;
moving a lift cylinder having a vacuum-means top for affixation to said tray into position below said tray;
unlocking said tray from said cover;
separating said lift cylinder, tray and seated-mask as a unit from said cover;
laterally transporting said lift cylinder, tray and seated mask as a unit to said fixed position;
raising said lift cylinder, tray and seated mask into position abutting a mask holder having vacuum-holding means at said fixed position;

transferring said mask from said tray to said vacuum-holding means; and moving said lift cylinder, vacuum-means top and tray downwardly and laterally from said fixed position leaving said mask vacuum-affixed to said vacuum-holding means and to allow unblocked use of said mask.

15. The method of claim 14 further including moving said lift cylinder, vacuum-means top and tray back to a position below said vacuum-holding means, transferring said mask from said vacuum-holding means to said tray, returning said lift cylinder, vacuum-means top, tray and mask as a unit to said cassette cover and transferring said mask and tray to a locked position in said cassette cover.

16. The method of claim 14 including mounting a calibration mask for a lithography system on said tray in said cassette and transferring said calibration mask to said vacuum-holding means to determine mask-to-wafer gap distance in said system.

17. The method of claim 14 comprising placing said vacuum-means top in engagement with said tray by raising the vacuum-means top to said tray and in which said separating step comprises lowering said tray and seated-mask to a position below said cassette top cover.

* * * * *